United States Patent
Park

(10) Patent No.: US 9,348,230 B2
(45) Date of Patent: May 24, 2016

(54) METHOD OF MANUFACTURING SEMICONDUCTOR DEVICE

(71) Applicant: SK hynix Inc., Icheon-si, Gyeonggi-do (KR)

(72) Inventor: Chang Ki Park, Suwon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 129 days.

(21) Appl. No.: 13/715,162

(22) Filed: Dec. 14, 2012

(65) Prior Publication Data

US 2014/0045124 A1  Feb. 13, 2014

(30) Foreign Application Priority Data

Aug. 8, 2012 (KR) .................. 10-2012-0086892

(51) Int. Cl.
*H01L 21/312* (2006.01)
*G03F 7/20* (2006.01)
*H01L 21/033* (2006.01)
*H01L 21/311* (2006.01)
*H01L 21/02* (2006.01)

(52) U.S. Cl.
CPC .............. *G03F 7/20* (2013.01); *H01L 21/0337* (2013.01); *H01L 21/0338* (2013.01); *H01L 21/31144* (2013.01); *H01L 21/0212* (2013.01); *H01L 21/02271* (2013.01)

(58) Field of Classification Search
CPC ................... H01L 21/0337; H01L 21/31144; H01L 21/0212
USPC .................................... 430/314, 317
See application file for complete search history.

(56) References Cited

U.S. PATENT DOCUMENTS

2008/0254627 A1 * 10/2008 Wells ........................... 438/689

* cited by examiner

*Primary Examiner* — Daborah Chacko Davis
(74) *Attorney, Agent, or Firm* — William Park & Associates Ltd.

(57) ABSTRACT

A method of manufacturing a semiconductor device includes: forming an etching mask layer on a semiconductor substrate having an etching target layer, patterning the etching mask layer to form a plurality of etching mask patterns, and forming a subsidiary layer surrounding the etching mask patterns having a uniform critical dimension and gap to form hard mask patterns including the subsidiary layer and the etching mask patterns.

12 Claims, 6 Drawing Sheets

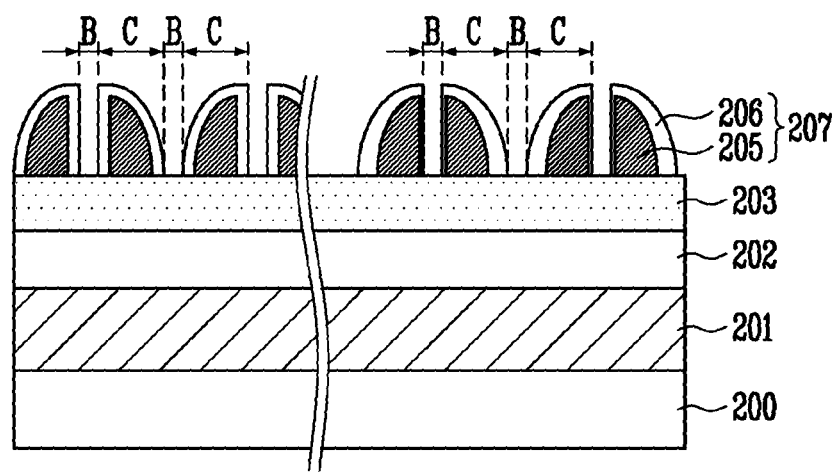
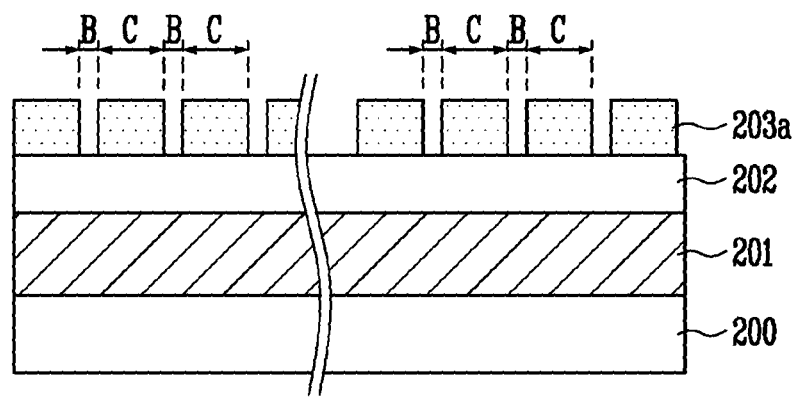

METHOD OF MANUFACTURING SEMICONDUCTOR DEVICE

CROSS-REFERENCE TO RELATED APPLICATION

This application claims priority to and the benefit of Korean Patent Application No. 10-2012-0086892, filed Aug. 8, 2012, the disclosure of which is incorporated herein by reference in its entirety.

BACKGROUND

The present invention relates generally to a method of manufacturing a semiconductor device, and more particularly to a method of manufacturing a semiconductor device by which patterns can be formed to have uniform critical dimension and pattern gap.

DISCUSSION OF RELATED ART

A typical semiconductor device patterning process may include forming a photoresist pattern on a predetermined etching target layer (e.g., a silicon layer, an insulating layer, or a conductive layer) required for forming a pattern, and etching the etching target layer using a photoresist pattern as an etch mask to form a desired pattern.

Due to increasing demand in the integration density of semiconductor devices, design rules for smaller critical dimensions (CDs) have been applied to semiconductor devices. In addition, techniques for forming contact holes having a smaller opening size than in a traditional lithography process or fine patterns disposed in smaller spaces have been required. Thus, lithography techniques using an ArF (193 nm) excimer laser as an energy source having a short wavelength have been developed.

However, since the development speed of exposure apparatuses is unlikely to catch up with the development speed of semiconductor devices, it is difficult to increase the integration density of the semiconductor devices. For this reason, research has been conducted on a method of forming fine patterns with a smaller critical dimension than the resolution of an exposure apparatus. However, this method entails complicated process operations and degraded reproducibility.

SUMMARY OF THE INVENTION

The present invention is directed to a method of manufacturing a semiconductor device by which patterns can be formed to have uniform critical dimension and pattern gap. In this method, after forming a plurality of mask patterns on a semiconductor substrate, a subsidiary layer surrounding sidewalls of the plurality of mask patterns is formed so that the plurality of mask patterns can have uniform critical dimension and pattern gap.

An embodiment of the present invention provides a method of manufacturing a semiconductor device, including: forming an etching mask layer on a semiconductor substrate having an etching target layer, patterning the etching mask layer to form a plurality of etching mask patterns, and forming a subsidiary layer surrounding the etching mask patterns having uniform critical dimension and pattern gap to form hard mask patterns encompassing the subsidiary layer and the etching mask patterns.

Another embodiment of the present invention provides a method of manufacturing a semiconductor device, including: forming a hard mask layer and a sacrificial layer on a semiconductor substrate having an etching target layer, patterning the sacrificial layer to form a plurality of sacrificial patterns, forming spacers on sidewalls of the plurality of sacrificial patterns, removing the plurality of sacrificial patterns, forming a subsidiary layer surrounding the spacers having a uniform pattern gap to form a plurality of mask patterns, and patterning the hard mask layer by an etching process using the plurality of mask patterns to form hard mask patterns.

Another embodiment of the present invention provides a method of manufacturing a semiconductor device, including: forming a hard mask layer and a first etching mask layer on a semiconductor substrate having an etching target layer, patterning the first etching mask layer to form a plurality of first etching mask patterns, forming spacers on sidewalls of the plurality of first etching mask patterns, forming a second etching mask layer on the entire structure including the plurality of first etching mask patterns and the spacers, etching the second etching mask layer until the spacers are exposed to form second etching mask patterns, removing the exposed spacers, forming a subsidiary layer surrounding the first etching mask patterns and the second etching mask patterns having uniform critical dimension and pattern gap, and patterning the hard mask layer by an etching process using the plurality of mask patterns to form hard mask patterns.

BRIEF DESCRIPTION OF THE DRAWINGS

The above and other features and advantages of the present invention will become more apparent to those of ordinary skill in the art by describing in detail various embodiments thereof with reference to the attached drawings in which:

FIGS. 2A through 2E are cross-sectional views illustrating a method of manufacturing a semiconductor device according to another embodiment of the present invention.

DETAILED DESCRIPTION OF EMBODIMENTS

Figure 1A:
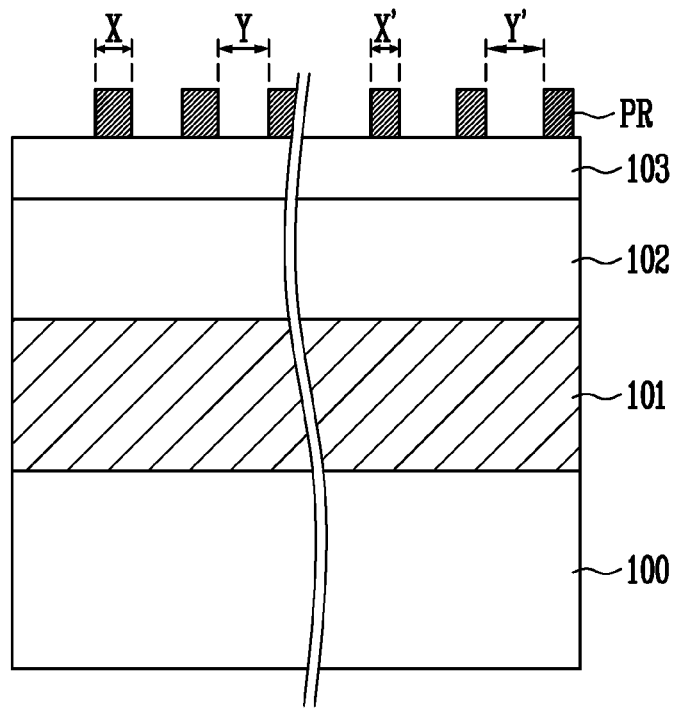
FIGS. 1A through 1D are cross-sectional views illustrating a method of manufacturing a semiconductor device according to an embodiment of the present invention.

The present invention will be described more fully hereinafter with reference to the accompanying drawings, in which various embodiments of the invention are shown. This invention may, however, may be embodied in different forms and should not be construed as limited to the embodiments set forth herein. Rather, these various embodiments are provided so that this disclosure is thorough and complete and fully conveys the scope of the present invention to one skilled in the art. In the drawings, like numbers refer to like elements.

FIGS. 1A through 1D are cross-sectional views illustrating a method of manufacturing a semiconductor device according to an embodiment of the present invention.

Referring to FIG. 1A, etching target layers 101 and 102 may be formed on a semiconductor substrate 100. The etching target layers may include at least one of an interlayer insulating layer 101 and a hard mask layer 102. Thereafter, an etching mask layer 103 and a photoresist pattern PR may be formed on the etching target layers 101 and 102.

The photoresist pattern PR should be formed on the etching mask layer 103 to have a critical dimension X and a gap Y between patterns. However, during an exposure process for forming the photoresist pattern PR, the critical dimension X and gap Y of the photoresist pattern PR may be modified into having a critical dimension X' and a gap Y' according to a position of a wafer (i.e., a positional difference between a center region and an edge region) as shown in FIG. 1A.

Figure 1B:
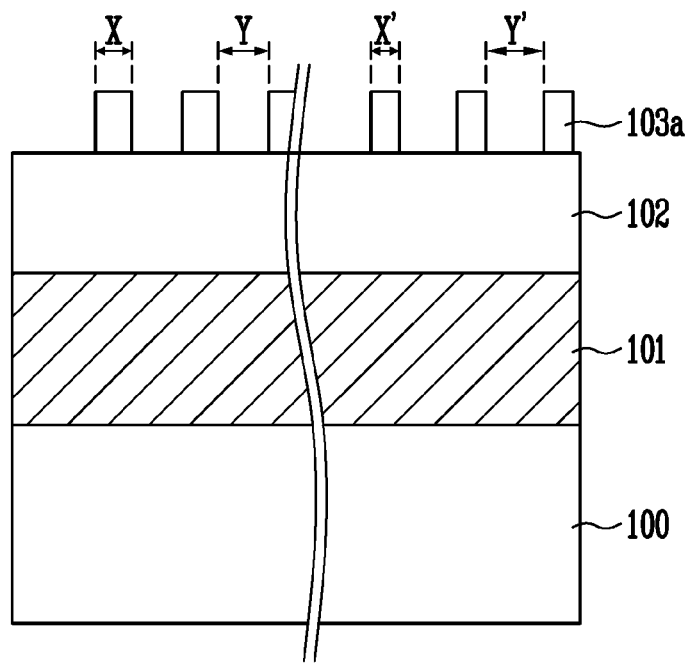

Referring to FIG. 1B, the etching mask layer 103 may be etched by an etching process using the photoresist pattern PR as a mask to form an etching mask pattern 103a. Thereafter, the photoresist pattern PR may be removed.

As described above, when the critical dimension X and gap Y of the photoresist pattern PR are nonuniform, the etching mask pattern 103a may accordingly be formed with a nonuniform critical dimension X and a nonuniform gap Y.

Figure 1C:
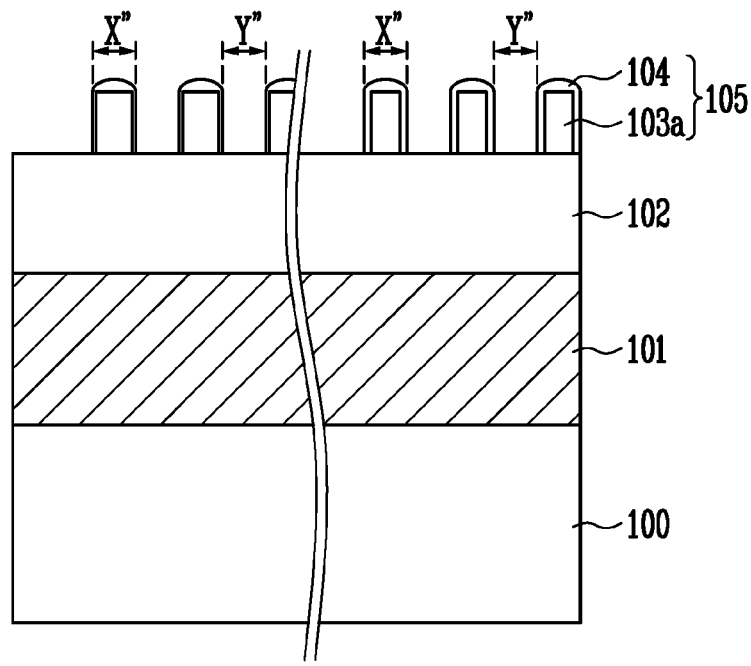

Referring to FIG. 1C, a subsidiary layer 104 may be formed to surround sidewalls and a top surface of the etching mask pattern 103a. The subsidiary layer 104 may be formed of a polymer layer. The subsidiary layer 104 may be formed using a deposition-etch-deposition (DED) method including repeating a deposition process and an etching process a predetermined number of times. The subsidiary layer 104 may be formed using $CF_4$, $CHF_4$, and $O_2$ gases. The subsidiary layer 104 may be formed of a $CF_x$-based polymer layer. When the subsidiary layer 104 is formed on sidewalls of the etching mask pattern 103a using a DED method, the thickness of the subsidiary layer 104 formed on the sidewalls of the etching mask pattern 103a may differ according to the critical dimension X and gap Y of the etching mask pattern 103a. This is because the thickness of the subsidiary layer 104 formed on the sidewalls of the etching mask pattern 103a differs according to an aspect ratio of the etching mask pattern 103a. That is, the subsidiary layer 104 formed on the etching mask pattern 103a having a relatively high aspect ratio may have a greater thickness than when the etching mask pattern 103a has a relatively low aspect ratio. Accordingly, when the subsidiary layer 104 is formed on the sidewalls of the etching mask patterns 103a having different aspect ratios, as the number of repetitions of deposition and etching processes included in the DED method for forming the subsidiary layer 104 increases, a critical dimension X" of mask patterns 103a and 104 (or mask patterns 105) and a gap Y" of the mask patterns 105 may become more uniform.

Figure 1D:
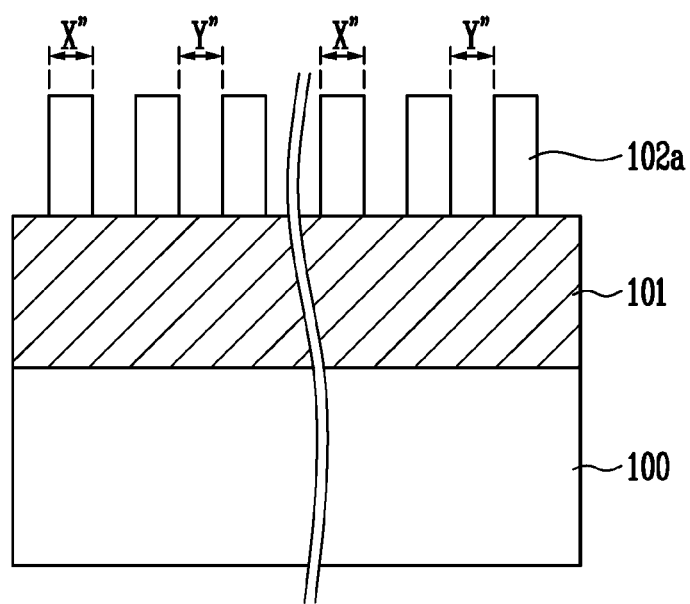

Referring to FIG. 1D, the hard mask layer 102 may be patterned by an etching process using the mask patterns 105 as an etch mask to form hard mask patterns 102a. The mask patterns 105 may be removed after the etching process. Alternatively, the mask patterns 105 may be left and used as a mask during a subsequent etching process.

Although not shown in the drawings, the etching target layer 101 may be etched by an etching process using the hard mask pattern 102a.

The present embodiment describes that the subsidiary layer 104 is formed after forming the etching mask pattern 103a and before forming the hard mask pattern 102a. However, in another embodiment, the etching mask pattern 103a may first be formed, the hard mask pattern 102a may next be formed using the etching mask pattern 103a, and a subsidiary layer 104 may be formed lastly on sidewalls and top surface of the hard mask pattern 102a so that the final formed patterns may be formed to have uniform critical dimension and gap. In another embodiment, the subsidiary layer 104 may be formed after forming the etching mask pattern 103a and before forming the hard mask pattern 102a, and an additional subsidiary layer may be formed on sidewalls and a top surface of the hard mask pattern 102a so that the final formed patterns may be formed to have a more uniform critical dimension and gap.

In the present embodiment as described above, the subsidiary layer 104 may be formed on the sidewalls of the etch mask pattern 103a using a DED method, thereby forming mask patterns 105 with uniform critical dimension and pattern gap.

FIGS. 2A through 2E are cross-sectional views illustrating a method of manufacturing a semiconductor device according to another embodiment of the present invention.

Figure 2A:
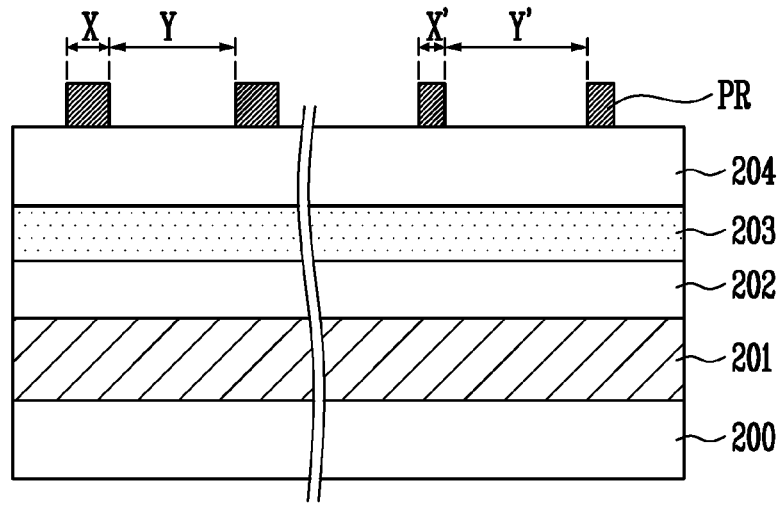

Referring to FIG. 2A, etching target layers 201 and 202 may be formed on a semiconductor substrate 200. The etching target layers 201 and 202 may include at least one of a lower structure layer 201 and an interlayer insulating layer 202. Thereafter, a hard mask layer 203 and a sacrificial layer 204 may be formed on the etching target layers 201 and 202. In this case, the hard mask layer 203 may be formed of a different hetero material from that of the etching target layers 201 and 202, more specifically, any hetero material having a high etching selectivity with respect to the materials comprising the etching target layers 201 and 202.

Thereafter, a photoresist pattern PR may be formed on the sacrificial layer 204.

The photoresist pattern PR should be formed on the sacrificial layer 204 to have a predetermined critical dimension X and a gap Y between patterns. However, during an exposure process for forming the photoresist pattern PR, the critical dimension X and gap Y of the photoresist pattern PR may be modified into a critical dimension X' and a gap Y' according to a position of a wafer, that is, a positional difference between a central region and an edge region as shown in FIG. 2A.

Figure 2B:
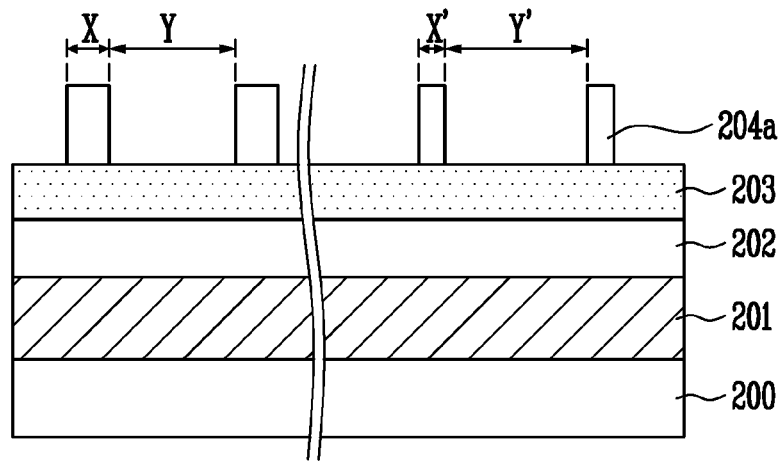

Referring to FIG. 2B, the sacrificial layer 204 may be etched by an etching process using the photoresist pattern PR as a mask to form a sacrificial pattern 204a. Thereafter, the photoresist pattern PR may be removed. As described above, when the critical dimension X and gap Y of the photoresist pattern PR are nonuniform, the sacrificial pattern 204a may accordingly be formed with a nonuniform critical dimension X and a nonuniform gap Y.

Figure 2C:
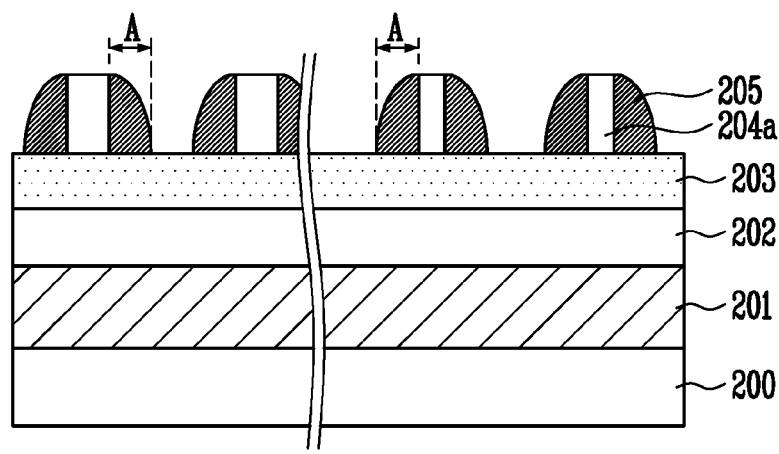

Referring to FIG. 2C, spacers 205 may be formed on sidewalls of the sacrificial pattern 204a. The formation of the spacers 205 may include forming a spacer insulating layer on the entire structure including the sacrificial pattern 204a and etching the spacer insulating layer to leave the spacer insulating layer at a predetermined thickness only on the sidewalls of the sacrificial pattern 204a as shown. In this case, all the spacers 205 may be formed to an equal thickness A. The spacers 205 may be formed of a material having high etch selectivity with respect to the sacrificial pattern 204a.

Referring to FIG. 2D, the sacrificial patterns 204a may be selectively removed. In this case, the selective removal process may be performed by a wet etching process or dry etching process using the spacers 205 and the hard mask layer 203 as a barrier layer.

Thereafter, a subsidiary layer 206 may be formed on sidewalls and top surfaces of the spacers 205. The subsidiary layer 206 may be formed of a polymer layer. The subsidiary layer 206 may be formed using a DED method including repeating a deposition process and an etching process a predetermined number of times. The subsidiary layer 206 may be formed using $CF_4$, $CHF_4$, and $O_2$ gases. The subsidiary layer 206 may be formed of a $CF_x$-based polymer layer. When the subsidiary layer 206 is formed on sidewalls of the spacers 205 using a DED method, the thickness of the subsidiary layer 206 may differ according to the gap Y of the spacers 205. That is, the subsidiary layer 206 formed on the sidewalls of the spacers 205 formed with a relatively large gap may have a greater thickness than the subsidiary layer 206 formed on the sidewalls of the spacers 205 formed with a relatively small gap. Accordingly, when the subsidiary layer 206 is formed on the sidewalls of the spacers 205 formed with different gaps, as the number of repetitions of deposition and etching processes included in the DED method for forming the subsidiary layer 206 increases, a critical dimension C of mask patterns 205 and 206 (or mask patterns 207) and a gap B of the mask patterns 207 may become more uniform.

Referring to FIG. 2E, the hard mask layer 203 may be patterned by an etching process using the mask patterns 207 as an etch mask, thereby forming hard mask patterns 203a.

The mask patterns 207 may be removed after the etching process. Alternatively, the mask patterns 207 may be left and used as a mask during a subsequent etching process.

Although not shown in the drawings, the etching target layer 201 and 202 may be etched by an etching process using the hard mask pattern 203a.

The present embodiment describes that the subsidiary layer 206 is formed after forming the spacers 205 and before forming the hard mask pattern 203a. However, in another embodiment, the spacers 205 may first be formed, the hard mask pattern 203a may next be formed using the spacers 205, and a subsidiary layer may be formed last on sidewalls and top surface of the hard mask pattern 203a so that the final formed patterns may have a uniform critical dimension and gap. In another embodiment, the subsidiary layer 206 may be formed after forming the spacers 205 and before forming the hard mask pattern 203a, and an additional subsidiary layer may be formed on sidewalls and a top surface of the hard mask pattern 203a so that the final formed patterns may have a more uniform critical dimension and gap.

In the present embodiment as described above, a subsidiary layer may be formed on the sidewalls of the spacers 205 using a DED method, thereby forming the hard mask patterns 203a with a uniform critical dimension and pattern gap.

FIGS. 3A through 3F are cross-sectional views illustrating a method of manufacturing a semiconductor device according to another embodiment of the present invention.

Figure 3A:
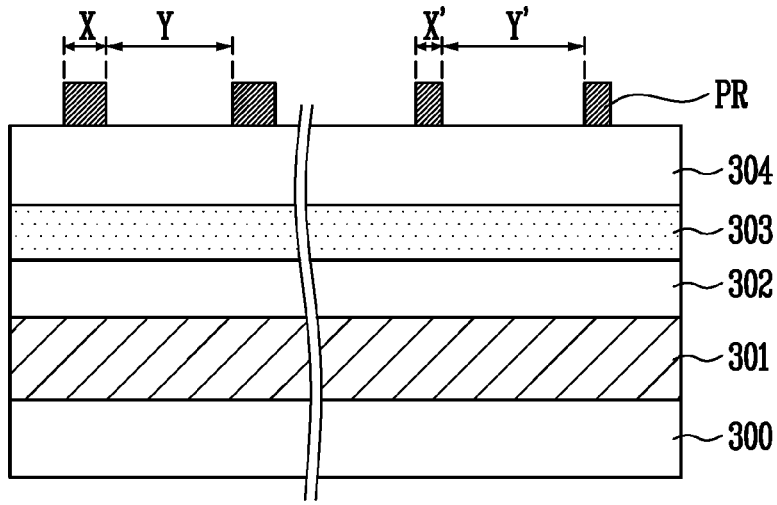
FIGS. 3A through 3F are cross-sectional views illustrating a method of manufacturing a semiconductor device according to another embodiment of the present invention.

Referring to FIG. 3A, an etching target layers 301 and 302 may be formed on a semiconductor substrate 300. The etching target layer may include at least one of a lower structure layer 301 and an interlayer insulating layer 302. Thereafter, a hard mask layer 303 and a first mask layer 304 may be formed on the etching target layer 301 and 302. In this case, the hard mask layer 303 and the first mask layer 304 may be formed of a different hetero material from that of the etching target layer 301 and 302, more specifically, any one material having a high etch selectivity with respect to the etching target layers 301 and 302. Also, the hard mask layer 303 and the first mask layer 304 may be formed of different hetero materials, more specifically, hetero materials having a high etch selectivity with respect to each other.

Subsequently, a photoresist pattern PR may be formed on the first mask layer 304.

The photoresist pattern PR should be formed on the first mask layer 304 to have a predetermined critical dimension X and a gap Y between patterns. Also, the critical dimension X may be about ⅓ the gap Y. However, during an exposure process for forming the photoresist pattern PR, the critical dimension X and gap Y of the photoresist pattern PR may be modified into a critical dimension X' and a gap Y' according to a position of a wafer (i.e., a positional difference between a center region and an edge region) as shown in FIG. 1A.

Figure 3B:
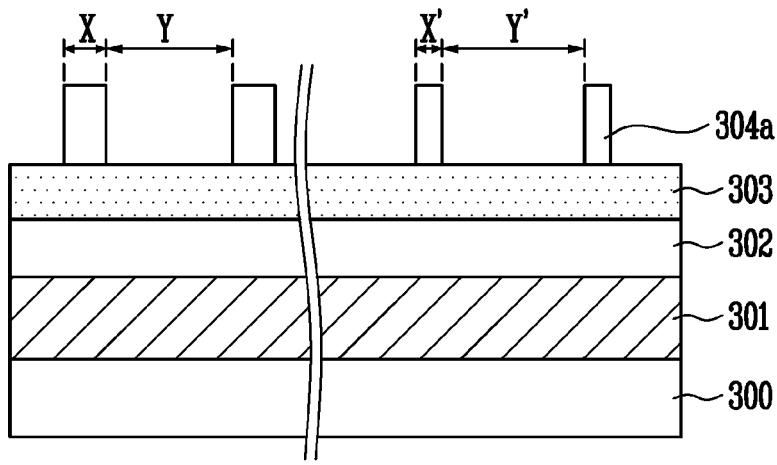

Referring to FIG. 3B, the first mask layer 304 may be etched by an etching process using the photoresist pattern PR as a mask to form a first mask pattern 304a. Thereafter, the photoresist pattern PR may be removed. As described above, when the critical dimension X and gap Y of the photoresist pattern PR are nonuniform, the first mask pattern 304a may accordingly be formed with a nonuniform critical dimension X and a nonuniform gap Y.

Figure 3C:
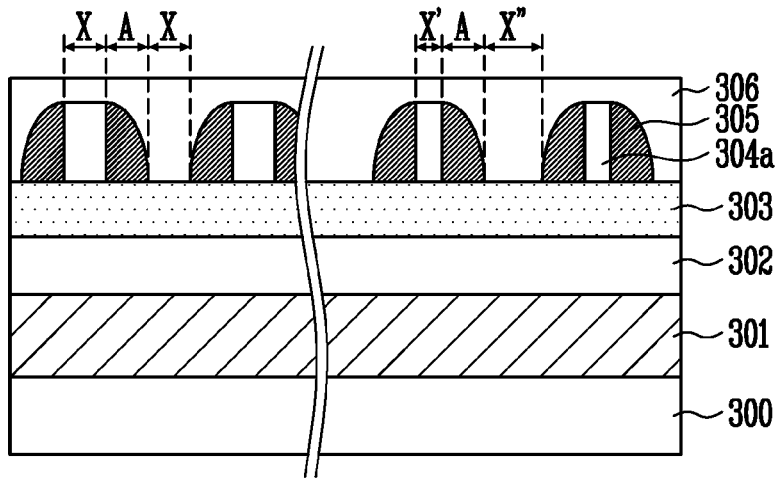

Referring to FIG. 3C, spacers 305 may be formed on sidewalls of the first mask pattern 304a. The formation of the spacers 305 may include forming a spacer insulating layer on the entire structure including the first mask pattern 304a and etching the spacer insulating layer to leave the spacer insulating layer at a predetermined thickness only on the sidewalls of the first mask pattern 304a as depicted. In this case, each of the spacers 305 may be formed equally to a thickness A equal to the critical dimension X of the first mask pattern 304a. The spacers 305 may be formed of a material having high etch selectivity with respect to that of the first mask pattern 304a.

Subsequently, a second mask layer 306 may be formed on the entire structure encompassing the first mask pattern 304a and the spacers 305.

Figure 3D:
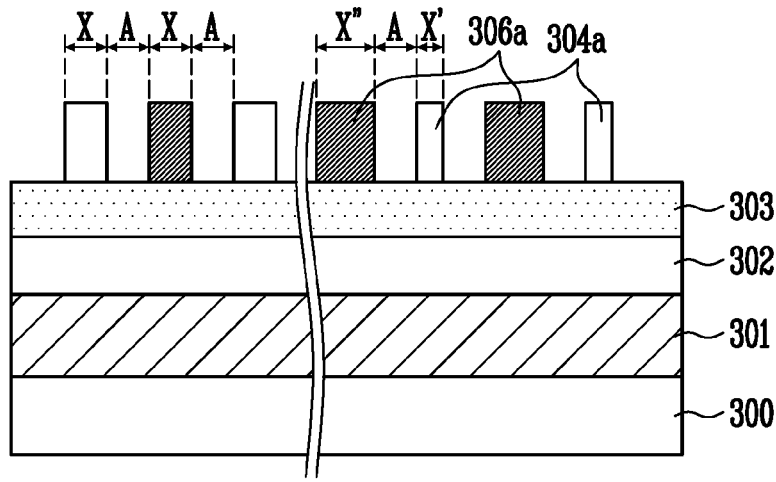

Referring to FIG. 3D, an etchback process may be performed to etch the second mask layer 306 until the spacers 305 are exposed. Thus, the second mask layer 306 may be patterned to form a second mask pattern 306a remaining in spaces between the spacers 305. Thereafter, the exposed spacers 305 may be removed.

Figure 3E:
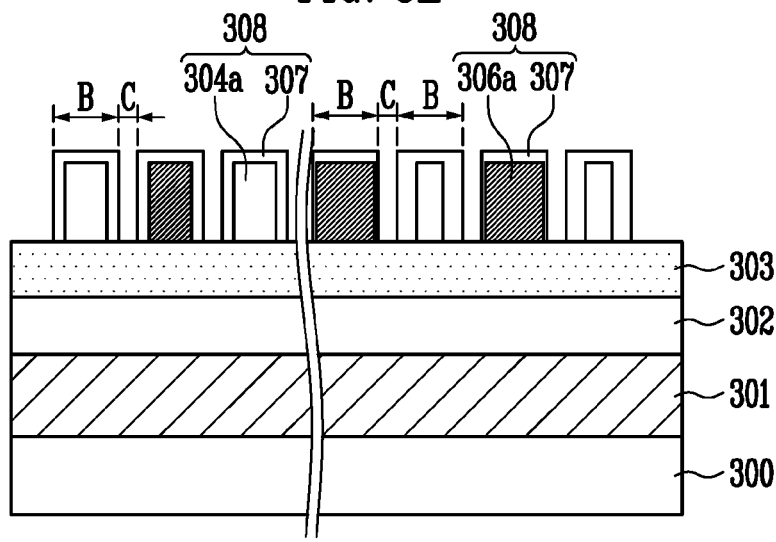

Referring to FIG. 3E, a subsidiary layer 307 may be formed to surround sidewalls and top surfaces of the first and second mask patterns 304a and 306a to form mask patterns 308. The subsidiary layer 307 may be formed of a polymer layer. The subsidiary layer 307 may be formed using a DED method including repeating a deposition process and an etching process a predetermined number of times. The subsidiary layer 307 may be formed using $CF_4$, $CHF_4$, and $O_2$ gases. The subsidiary layer 307 may be formed of a $CF_x$-based polymer layer. When the subsidiary layer 307 is formed on sidewalls of the first and second mask patterns 304a and 306a using a DED method, the thickness of the subsidiary layer 307 formed on the sidewalls of the first and second mask patterns 304a and 306a may differ according to the critical dimensions and gap of the first and second mask patterns 304a and 306a. This is because the thickness of the subsidiary layer 307 formed on the sidewalls of the first and second mask patterns 304a and 306a differs according to an aspect ratio of the first and second mask patterns 304a and 306a. That is, the subsidiary layer 307 formed on the first mask patterns 304a having a relatively high aspect ratio may have a greater thickness than the subsidiary layer 307 formed on the second mask pattern 306a having a relatively low aspect ratio. Accordingly, when the subsidiary layer 307 is formed on the sidewalls of the first and second mask patterns 304a and 306a having different aspect ratios, as the number of repetitions of deposition and etching processes included in the DED method for forming the subsidiary layer 307 increases, a critical dimension B of mask patterns 308 and a gap C between the mask patterns 308 may become more uniform.

Figure 3F:
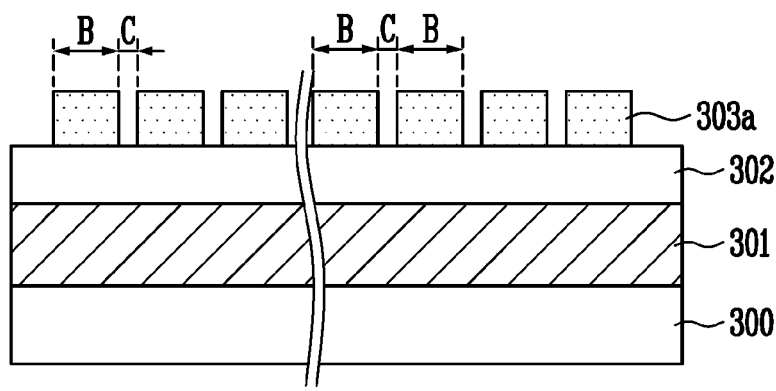

Referring to FIG. 3F, the hard mask layer 303 may be patterned by an etching process using the mask patterns 308 as an etch mask, thereby forming hard mask patterns 303a.

The mask patterns 308 may be removed after the etching process. Alternatively, the mask patterns 308 may be left and used as a mask during a subsequent etching process.

Although not shown in the drawings, the etching target layers 301 and 302 may be etched by an etching process using the hard mask pattern 303a.

The present embodiment describes that the subsidiary layer 307 is formed after forming the first and second mask patterns 304a and 306a and before forming the hard mask pattern 303a. However, in another embodiment, after the hard mask pattern 303a is formed using the first and second mask patterns 304a and 306a, a subsidiary layer may be formed on sidewalls and a top surface of the hard mask pattern 303a so that final formed patterns may have a uniform critical dimension and gap. In another embodiment, the subsidiary layer 307 may be formed after forming the first and second mask patterns 304a and 306a and before forming the hard mask pattern 303a first, the hard mask pattern 303a may be formed next, and an additional subsidiary layer may be formed on sidewalls and a top surface of the hard mask pattern 303a so that final formed patterns may be formed to have a more uniform critical dimension and gap.

In the present embodiment as described above, the subsidiary layer 307 may be formed on the sidewalls of the first and second mask patterns 304a and 306a using a DED method, thereby forming the hard mask patterns 303a with a uniform critical dimension and gap.

According to the present invention, a subsidiary layer can be formed to surround sidewalls of a plurality of mask patterns so that patterns with a constant critical dimension and gap can be formed.

In the drawings and specification, there have been disclosed various embodiments of the invention, and although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A method of manufacturing a semiconductor device, comprising:
    forming a hard mask layer and a sacrificial layer on a semiconductor substrate having an etching target layer;
    patterning the sacrificial layer to form a plurality of sacrificial patterns;
    forming spacers on sidewalls of the plurality of sacrificial patterns;
    removing the plurality of sacrificial patterns;
    forming a plurality of mask patterns each including a single spacer and a subsidiary layer surrounding the single spacer by repeating a deposition process to deposit the subsidiary layer to surround the spacers and an etching process to remove the subsidiary layer deposited in a gap between the spacers; and
    patterning the hard mask layer by an etching process using the plurality of mask patterns to form hard mask patterns,
    wherein a thickness of the subsidiary layer formed on sidewalls of the spacers is controlled according to the gap between the spacers.

2. The method of claim 1, wherein the forming of the plurality of sacrificial patterns comprises:
    forming a photoresist pattern on the sacrificial layer; and
    patterning the sacrificial layer using the photoresist pattern,
    wherein the photoresist pattern has different critical dimensions and gaps according to a position of a wafer.

3. The method of claim 1, wherein the subsidiary layer is formed of a polymer layer.

4. The method of claim 1, wherein the subsidiary layer is formed using $CF_4$, $CHF_4$, and $O_2$ gases.

5. The method of claim 1, wherein the thickness of the subsidiary layer formed on the sidewalls of the spacers formed with a relatively large gap is greater than the thickness of the subsidiary layer formed on the sidewalls of the spacers formed with a relatively small gap.

6. The method of claim 1, further comprising forming a subsidiary mask layer surrounding the hard mask patterns to control the hard mask patterns to have a uniform critical dimension and gap.

7. A method of manufacturing a semiconductor device, comprising:
    forming a hard mask layer and a first etching mask layer on a semiconductor substrate having an etching target layer;
    patterning the first etching mask layer to form a plurality of first etching mask patterns;
    forming spacers on sidewalls of the plurality of first etching mask patterns;
    forming a second etching mask layer on the entire structure encompassing the plurality of first etching mask patterns and the spacers;
    etching the second etching mask layer until the spacers are exposed, to form second etching mask patterns;
    forming a plurality of mask patterns including the first etching mask patterns and the second etching mask patterns and a subsidiary layer surrounding the first and second etching mask patterns by repeating a deposition process to deposit the subsidiary layer to surround the first etching mask patterns and the second etching mask patterns and an etching process to remove the subsidiary layer deposited in a gap between the first etching mask patterns and the second etching mask patterns; and
    patterning the hard mask layer by an etching process using the plurality of mask patterns to form hard mask patterns,
    wherein a thickness of the subsidiary layer formed on sidewalls of the first and second etching mask patterns is controlled according to an aspect ratio and the gap of the first and second etching mask patterns.

8. The method of claim 7, wherein the forming of the plurality of first etching mask patterns comprises:
    forming a photoresist pattern on the first etching mask layer; and
    patterning the first etching mask layer using the photoresist pattern,
    wherein the photoresist pattern has different critical dimensions and gaps according to a position of a wafer.

9. The method of claim 7, wherein the subsidiary layer is formed of a polymer layer.

10. The method of claim 7, wherein the subsidiary layer is formed using $CF_4$, $CHF_4$, and $O_2$ gases.

11. The method of claim 7, wherein the thickness of the subsidiary layer formed on the sidewalls of the first etching mask pattern having a relatively high aspect ratio is greater than the thickness of the subsidiary layer formed on the sidewalls of the second etching mask pattern having a relatively low aspect ratio.

12. The method of claim 7, further comprising forming a subsidiary mask layer surrounding the hard mask patterns to control the hard mask patterns to have a uniform critical dimension and gap.

* * * * *